(12) United States Patent
Johnson et al.

(10) Patent No.: US 7,666,004 B2
(45) Date of Patent: Feb. 23, 2010

(54) DEVICES, SYSTEMS, AND/OR METHODS REGARDING A PROGRAMMABLE LOGIC CONTROLLER

(75) Inventors: Joseph Andrew Johnson, Johnson City, TN (US); Victor Neal Norwood, Blountville, TN (US)

(73) Assignee: Siemens Industry, Inc., Alpharetta, GA (US)

( * ) Notice: Subject to any disclaimer, the term of this patent is extended or adjusted under 35 U.S.C. 154(b) by 263 days.

(21) Appl. No.: 11/771,318

(22) Filed: Jun. 29, 2007

(65) Prior Publication Data

US 2008/0052435 A1 Feb. 28, 2008

Related U.S. Application Data

(60) Provisional application No. 60/817,436, filed on Jun. 29, 2006.

(51) Int. Cl.
*H01R 12/00* (2006.01)
*H05K 1/00* (2006.01)
(52) U.S. Cl. .................................................. 439/76.1
(58) Field of Classification Search ............... 439/76.1, 439/65
See application file for complete search history.

(56) References Cited

U.S. PATENT DOCUMENTS 5,648,892 A * 7/1997 Wieloch et al. ............. 361/788
5,907,475 A * 5/1999 Babinski et al. ............. 361/719

\* cited by examiner

*Primary Examiner*—Javaid Nasri
(74) *Attorney, Agent, or Firm*—Jose de la Rosa

(57) ABSTRACT

Certain exemplary embodiments comprise a PLC housing comprising a plurality of board mounts. Each of the plurality of board mounts can be configured to physically position a board of a plurality of boards relative to at least one other system component. In certain exemplary embodiments, one or more of the plurality of board mounts might not be configured to electrically or communicatively couple the board to another system component.

21 Claims, 5 Drawing Sheets

DEVICES, SYSTEMS, AND/OR METHODS REGARDING A PROGRAMMABLE LOGIC CONTROLLER

CROSS-REFERENCES TO RELATED APPLICATIONS

This application claims priority to, and incorporates by reference herein in its entirety, U.S. Provisional Patent Application Ser. No. 60/817,436, filed 29 Jun. 2006.

BACKGROUND

Users, designers, and/or manufacturers of electrical processing systems such as programmable logic controllers (PLCs) might desire that any input/output (I/O) termination capability within a PLC occupy a relatively small space. Thus, a relatively high density of I/O points and/or terminations within the PLC might be desired.

SUMMARY

Certain exemplary embodiments comprise a PLC housing comprising a plurality of circuit board mounts. Each of the plurality of circuit board mounts can be configured to physically position a circuit board of a plurality of circuit boards relative to at least one other system component. In certain exemplary embodiments, one or more of the plurality of circuit board mounts might not be configured to electrically or communicatively couple the circuit board to another system component.

BRIEF DESCRIPTION OF THE DRAWINGS

A wide variety of potential practical and useful embodiments will be more readily understood through the following detailed description of certain exemplary embodiments, with reference to the accompanying exemplary drawings in which.

DETAILED DESCRIPTION

Certain exemplary embodiments can provide a PLC housing comprising a plurality of circuit board mounts. Each of the plurality of circuit board mounts can be configured to physically position a circuit board of a plurality of circuit boards relative to at least one other system component. In certain exemplary embodiments, one or more of the plurality of circuit board mounts might not be configured to electrically or communicatively couple the circuit board to another system component.

In certain exemplary embodiments, a PLC structure can be adapted to:

enable a use of substantially similar input/output (I/O) circuit boards within a PLC housing, an expansion I/O housing communicatively coupled to the PLC;

provide a structure that can provide a relatively high count of I/O points that can be communicatively coupled to a PLC of a predetermined size;

enable a PLC manufacturer to customize a PLC to provide a count of I/O points that can be communicatively coupled to the PLC that is customized to a user specification;

provide a reduced count of assemblies used to build a PLC product line;

reduce, in relative terms, design cycle time, design cost, time-to-market, and/or sustaining cost, etc.;

avoid use of a backplane;

utilize a "Rack Mount" style enclosure but not use a backplane;

provide an I/O circuit board count by a user in a PLC;

provide a customized PLC according to determined desires;

use a substantially similar I/O circuit board inside of a PLC housing as can be used in an expansion I/O housing;

utilize a relatively small count of dissimilar circuit board assemblies in a product family, such as, for example, 3, 5, 6, 8, 10, 12, 18, 24, 36, and/or any value or subrange therebetween;

provide a power supply (P/S) circuit board, a processor (CPU) circuit board, and/or one or more input/output (I/O) circuit boards, which can provide a predetermined count of inputs and/or outputs;

provide PLC circuit boards that are pluggably exchangeable in event of hardware, firmware, and/or software changes;

provide a PLC structure that supports both conventional expansion I/O (stackable) and/or a configurable housing with substantially similar electronic sub-assemblies;

allow sharing of sub-assemblies and/or achieve a relatively high I/O point count in a relatively low DIN-rail space (where a DIN-rail is a rail assembly compliant with a German standard DIN 46277); and/or provide a substantially vertical structure adapted to provide a predetermined count of I/O points in a relatively small footprint and/or to assemble I/O circuit boards inside the PLC housing with a footprint that is relatively compact.

Figure 1:
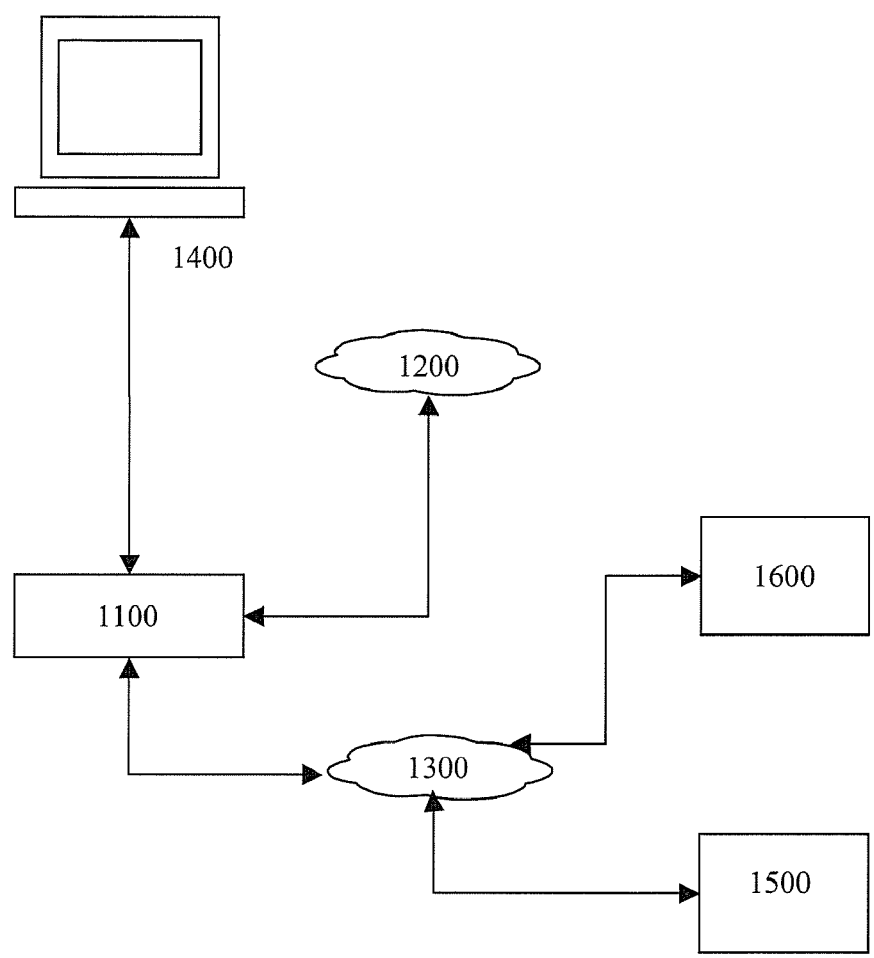
FIG. 1 is a block diagram of an exemplary embodiment of a system 1000.

FIG. 1 is a block diagram of an exemplary embodiment of a system 1000, which can comprise an information device 1400 that can be communicatively coupled, via a first network 1200, to a programmable logic controller (PLC) 1100. PLC 1100 can be communicatively coupled to one or more sensors, actuators, and/or field devices, such as actuator 1500 and/or sensor 1600, via a second network 1300. Via information provided by sensors, such as sensor 1600, and/or results from a control of actuators, such as actuator 1500, PLC 1100 can be adapted to control a process in hard real-time. Sensor 1600 can be a device adapted to automatically sense, perceive, detect, and/or measure a physical property (e.g., pressure, temperature, flow, mass, heat, light, sound, humidity, proximity, position, velocity, vibration, loudness, voltage, current, capacitance, resistance, inductance, and/or electromagnetic radiation, etc.) and/or convert that physical quantity into a signal. Examples include proximity switches, stain gages, photo sensors, thermocouples, level indicating devices, speed sensors, accelerometers, electrical voltage indicators, electrical current indicators, on/off indicators, and/or flowmeters, etc. Actuator 1500 can be adapted to control and/or position any controlled device associated with a process such as a valve, electric motor rotational speed controller, damper, and/or rheostat, etc.

Figure 2:
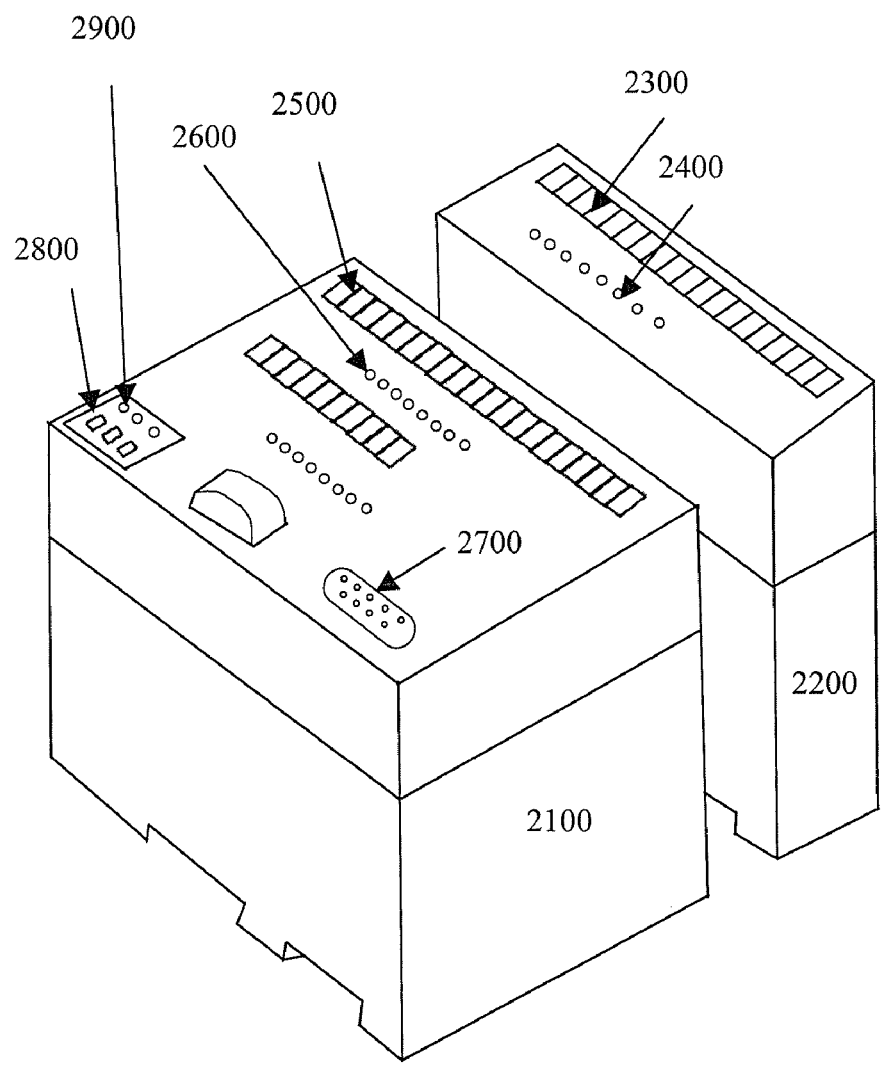
FIG. 2 is a perspective view of an exemplary embodiment of a system 2000.

FIG. 2 is a perspective view of an exemplary embodiment of a system 2000, which can comprise a PLC 2100 and/or an expansion I/O module 2200. PLC 2100 can comprise a plurality of I/O ports 2500. Activity and/or electrical conductivity associated with one or more of I/O ports 2500 can be indicated via one or more indicators 2600. Expansion I/O module 2200 can comprise a plurality of I/O ports 2300. Activity and/or electrical conductivity associated with one or more of I/O ports 2300 can be indicated via one or more indicators 2400. Indicators 2400 and/or indicators 2600 can be light emitting diodes, liquid crystal elements, and/or illuminated lamps, etc. Expansion I/O module 2200 can be configured to be connected via a plug connection to PLC 2100. PLC 2100 can comprise a plug component portion communicatively couplable to a corresponding plug component portion of expansion I/O module 2200. Expansion I/O module 2200 can be configured to mount a plurality of expansion Input/Output circuit boards that are substantially identical to at least one circuit board of a plurality of circuit boards comprised by PLC 2100.

PLC 2100 can comprise a port 2700 via which PLC 2100 can be communicatively coupled to an information device and/or peripheral component. PLC 2100 can comprise a plurality of ports 2800, which can be adapted to be communicatively coupled to an electrical energy source. PLC 2100 can comprise a plurality of screw terminals 2900, which can be adapted to electrically couple an energy source to PLC 2100.

Figure 3:
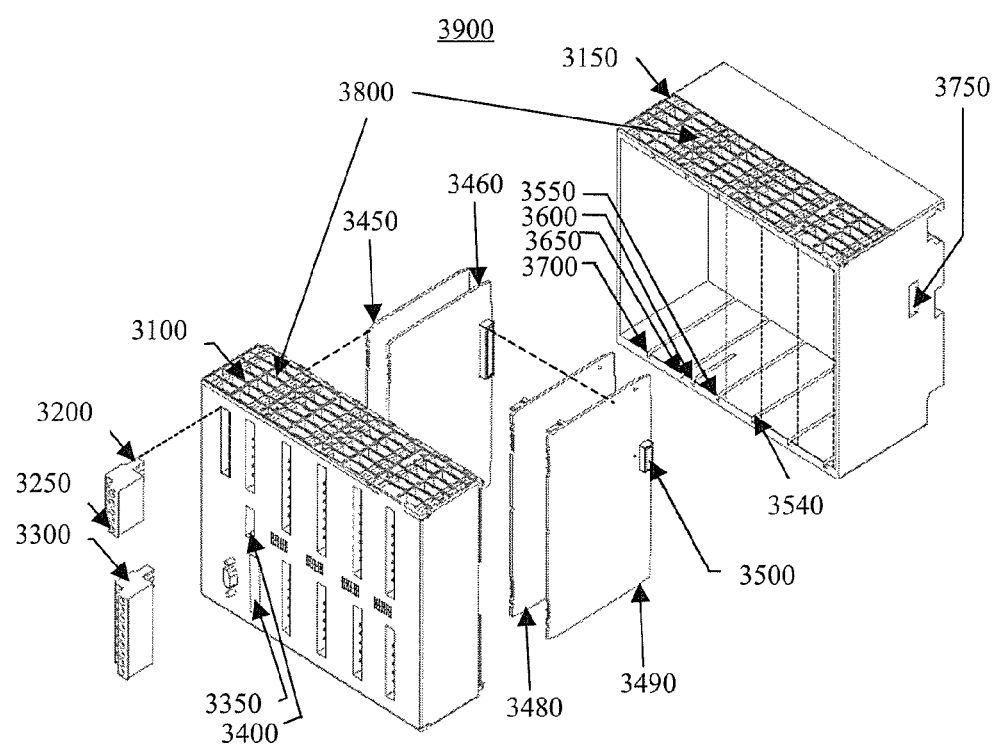
FIG. 3 is a exploded perspective view of an exemplary embodiment of a system 3000.

FIG. 3 is a exploded perspective view of an exemplary embodiment of a system 3000, which can comprise a first portion 3100 of a PLC housing 3900 and/or a second portion 3150 of a PLC housing 3900. First portion 3100 and second portion 3150 can be adapted to be releasably coupled together to form PLC housing 3900. Second portion 3150 can be adapted to provide a plurality of slots 3550, 3600, 3650, and/or 3700, each of which can be adapted to receive one of a plurality of circuit boards 3450, 3460, 3480, and/or 3490. For example, slot 3540 can be adapted to receive a first I/O circuit board 3490, slot 3550 can be adapted to receive a second I/O circuit board 3480, slot 3600 can be adapted to receive an annex card (not shown), slot 3650 can be adapted to receive a processor circuit board 3460 that comprises a central processing unit, and/or slot 3700 can be adapted to receive a power supply circuit board 3450. This example is illustrative and slots can be provided that result in circuit boards being received in any order in second portion 3150. In certain exemplary embodiments, second portion 3150 can be adapted to receive four distinct I/O circuit boards. Second portion 3150 can define a port 3750, which can be adapted to receive a plug connector of an expansion I/O module. The expansion I/O module can be communicatively coupled to the PLC housing via port 3750 to provide additional inputs and/or outputs to the PLC. The PLC housing 3900 can be configured to substantially surround each of plurality of circuit boards 3450, 3460, 3480, and/or 3490.

First portion 3100 can define a plurality of ports, such as port 3350 and/or port 3400. In certain exemplary embodiments, port 3350 can be adapted to receive a memory module associated with system 3000. Port 3400 can be adapted to provide an opening via which a connector can be attached to an annex card. One of the plurality of ports can be adapted to receive an electrical energy source connector 3200, which can comprise a plurality of terminals 3250. Each of plurality of terminals 3250 can be adapted to be electrically coupled to a wire carrying electrical energy. Energy source connector 3200 can be a direct current (DC) jack or an alternating current (AC) jack that can be adapted to be electrically couplable to a power supply circuit board and/or an energy source. Each of first portion 3100 and/or second portion 3150 can define a plurality of vents 3800, which can be adapted to release a flow of heat energy from system 3000 to a surrounding environment. Each of the plurality of ports can be used to couple one or more external devices and/or connections to an edge of one of plurality of circuit boards 3450, 3460, 3480, and/or 3490. Thereby, system 3000 can be communicatively coupled to a plurality of external devices such as, for example, process inputs and/or outputs, an energy source, a non-process network via which system communicates with one or more information devices in soft real-time, and/or releasably attachable memory devices, etc. For example, the PLC housing can be adapted to receive a terminal block 3300, which can be configured to be communicatively coupled to an Input/Output circuit board of a plurality of circuit boards 3450, 3460, 3480, and/or 3490.

Each of plurality of circuit boards 3450, 3460, 3480, and/or 3490 can comprise one or more surface mount connectors 3500. Surface mount connectors 3500 can be adapted to communicatively couple the plurality of circuit boards 3450, 3460, 3480, and/or 3490 to each other. In certain exemplary embodiments, first portion 3100 and/or second portion 3150 can lack a backplane and/or mounts comprised thereby might not electrically or communicatively couple the plurality of circuit boards 3450, 3460, 3480, and/or 3490. A combined system of PLC housing 3900, slots 3550, 3600, 3650, and/or 3700, a plurality of circuit board mounts (not shown) and/or a plurality of coupled surface mount connectors 3500 between can be configured to mount plurality of circuit boards 3450, 3460, 3480, and/or 3490 such that a first plane defined by a first circuit board of said plurality of circuit boards and each plane defined by each other circuit board of the plurality of circuit boards 3450, 3460, 3480, and/or 3490 can be substantially parallel.

Figure 4:
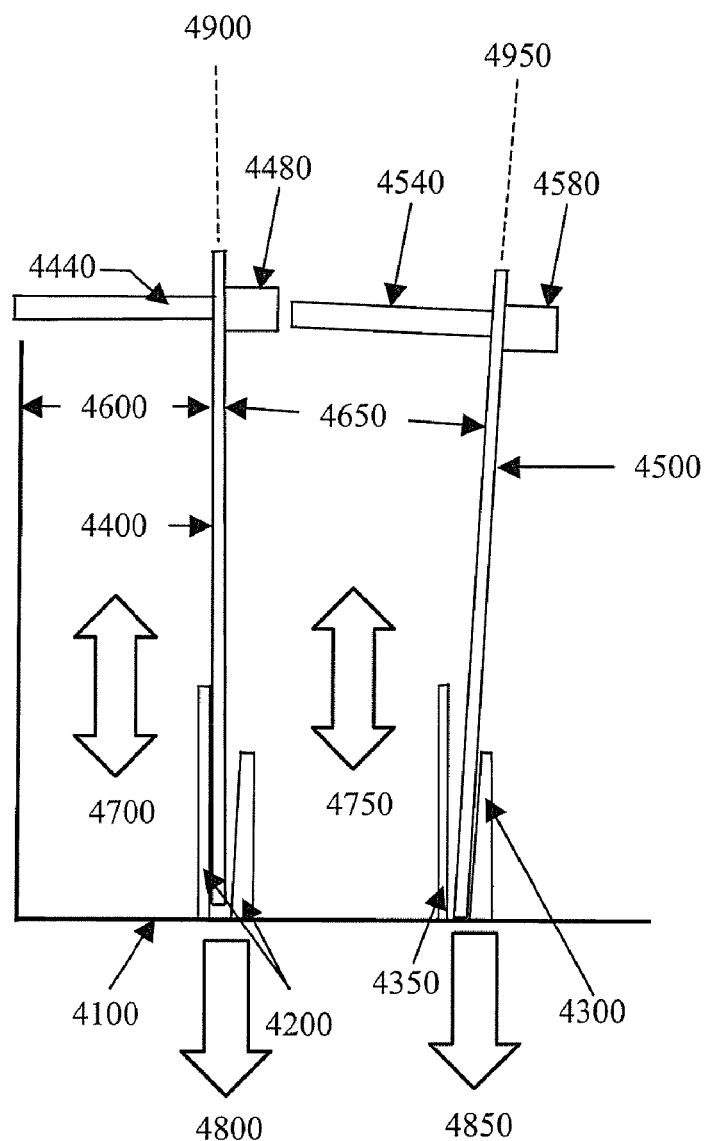
FIG. 4 is a side view of an exemplary embodiment of a system 4000.

FIG. 4 is a side view of an exemplary embodiment of a system 4000, which can comprise a portion of a PLC housing 4100. PLC housing 4100 can comprise a plurality of circuit board mounts 4200. In certain exemplary embodiments each of plurality of circuit board mounts 4200 might not be coupled to a backplane or otherwise adapted to electrically and/or communicatively couple first circuit board 4400 and second circuit board 4500. Each of plurality of circuit board mounts 4200 can comprise a first mount prong 4300 and/or a second mount prong 4350. Each first mount prong 4300 and/or or second mount prong 4350 can be sufficiently flexible to allow circuit boards such as a first circuit board 4400 and/or a second circuit board 4500 to be mounted therein and/or mutually communicatively coupled via surface mount connectors 4480 and/or 4540. Each of plurality of circuit board mounts 4200 can be configured to at least loosely and/or approximately physically position first circuit board 4400 and/or second circuit board 4500, of a plurality of circuit boards, relative to at least one other system component, such as a portion of PLC housing 4100. In certain exemplary embodiments, the plurality of circuit board mounts might not be configured to electrically and/or communicatively couple a circuit board, of the plurality of circuit boards, to any other system component. PLC housing 4100 might not comprise and/or be electrically and/or communicatively coupled to a backplane.

First circuit board 4400 and/or a portion of PLC housing 4100 can at least partially define a first substantially convective heat transfer channel 4600, which can be adapted to substantially convectively transfer a first flow of heat 4700 to one or more vents comprised by PLC housing 4100. First flow of heat 4700 can be generated by at least one or more electrical components comprised by first circuit board 4400. First circuit board 4400 can comprise a first surface mount connector 4440 and/or a second surface mount connector 4480. In certain exemplary embodiments, first surface mount connector 4440 can be used to directly or indirectly communicatively couple the PLC associated with PLC housing 4100 to one or more external systems. The one or more external systems can comprise a communications interface to a network and/or an input/output interface. The network communicatively coupled to the PLC via first surface mount connector 4440 can be a network that utilizes a non-PLC communications protocol. First surface mount connector 4440 can extend to near an outer surface or beyond the outer surface of PLC housing 4100. Second circuit board 4500 can comprise a first surface mount connector 4540 and/or a second surface mount connector 4580. In certain exemplary embodiments, first surface mount connector 4440 of first circuit board 4400 and first surface mount connector 4540 of second circuit board 4500 can be substantially similar. In certain exemplary embodiments, second surface mount connector 4480 of first circuit board 4400 and second surface mount connector 4580 of second circuit board 4500 can be substantially similar.

When coupled, second surface mount connector 4480 of first circuit board 4400 and/or first surface mount connector 4540 of second circuit board 4500 can be configured to at least partially define a gap and/or a second substantially convective heat transfer channel 4650 between first circuit board 4400 and/or second circuit board 4500. A second flow of heat 4750 can be generated by components of first circuit board 4400 and/or second circuit board 4500. Second flow of heat 4750 can be substantially convectively dissipated via gap and/or substantially convective heat transfer channel 4600 to one or more vents comprised by PLC housing 4100. Each of first circuit board 4400 and/or second circuit board 4500 can be conductively coupled for heat transfer to PLC housing 4100 via one of the plurality of circuit board mounts 4200. First circuit board 4400 can be adapted to generate and/or substantially conductively transfer a third flow of heat 4800 to and/or via PLC housing 4100. Second circuit board 4500 can be adapted to generate and/or substantially conductively transfer a fourth flow of heat 4850 to and/or via PLC housing 4100. Each of first flow of heat 4700, second flow of heat 4750, third flow of heat 4800, and/or fourth flow of heat 4850 can be three dimensional in nature and/or can flow in any direction within PLC housing 4100. Schematic arrows depicting each of first flow of heat 4700, second flow of heat 4750, third flow of heat 4800, and/or fourth flow of heat 4850 are in no way limiting regarding heat flow directionality.

When coupled, second surface mount connector 4480 of the first circuit board and/or first surface mount connector 4540 of the second circuit board can be configured to tightly physically couple and/or restrain flexure of second circuit board 4500 relative to first circuit board 4400 such that, for any flexure of first circuit board 4400, at least a portion of a second plane 4950 defined by second circuit board 4500 will be substantially parallel to at least a portion of a first plane 4900 defined by first circuit board 4400. In certain exemplary embodiments, first circuit board 4400 and/or second circuit board 4500 can be further secured and/or restrained from motion via a plurality of slots in a portion of PLC housing 4100, such as slots similar to plurality of slots 3550, 3600, 3650, and/or 3700 illustrated in FIG. 3.

First circuit board 4400 and/or second circuit board 4500 can be selected from a group comprising a power supply circuit board, a processor circuit board, and/or an Input/Output circuit board. First circuit board 4400 can be substantially planar, define a first plane. First circuit board 4400 can comprise second surface mount connector 4480, which can be configured to communicatively couple first circuit board 4400 to second circuit board 4500 that comprises a corresponding mating connector, namely first surface mount connector 4540 of second circuit board 4500.

FIG. 4 illustrates a potential order of assembly and/or how first circuit board 4400 and second circuit board 4500 can be coupled together. Certain exemplary embodiments can comprise connectors that can comprise a plug (e.g., first surface mount connector 4540 of second circuit board 4500) on one side and a corresponding socket (e.g., second surface mount connector 4480 of first circuit board 4400) on the other. Each connector of connectors 4440, 4480, 4540, and/or 4580 can be Surface Mount Technology (SMT) connectors. In certain exemplary embodiments, pins of one or more of connectors 4440, 4480, 4540, and/or 4580 need not be considered pass through (e.g., a signal that is on pin 1 of connector 4540 need not necessarily be the same signal that is on pin 1 of connector 4580).

In certain exemplary embodiments, circuit boards can be installed in PLC housing 4100 by:
  inverting a portion of a PLC housing 4100 on a work area;
  sliding circuit board 4400 into place up against a straight card guide rail (the prong associated with first circuit board 4400 that corresponds to second prong 4350 associated with second circuit board 4500); and/or
  sliding second circuit board 4500 in the mount comprising first prong 4300 and second prong 4350, to the right in at an angle and/or couple first surface mount connector 4540 of second circuit board 4500 to second surface mount connector 4480 of first circuit board 4400. System 4000 might not utilize a "Backplane".

Figure 5:
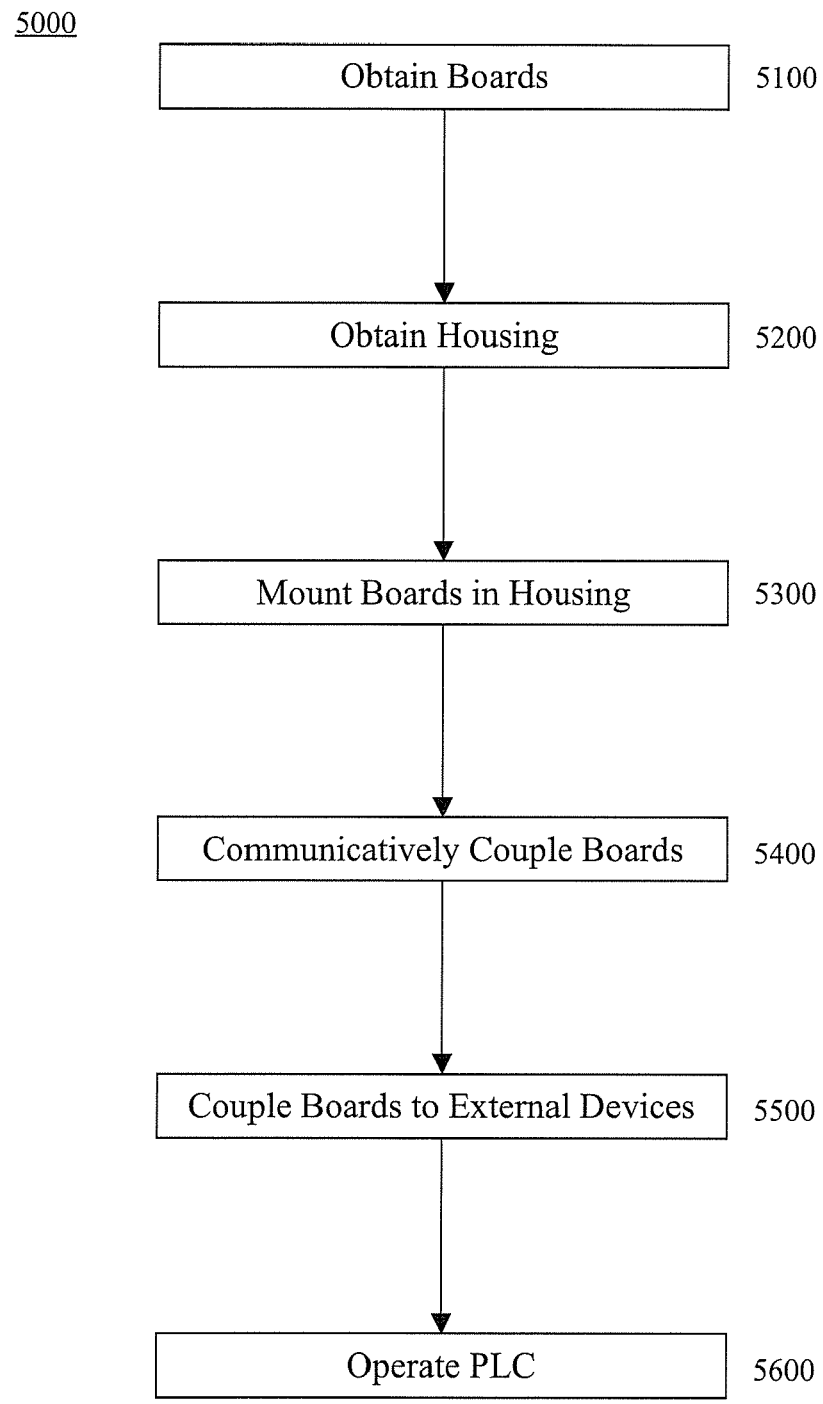
FIG. 5 is a flowchart of an exemplary embodiment of a method 5000.

FIG. 5 is a flowchart of an exemplary embodiment of a method 5000. At activity 5100, a plurality of circuit boards associated with a PLC can be obtained. The plurality of circuit boards can comprise a processor circuit board, power supply circuit board, annex card, and/or one or more I/O circuit boards.

At activity 5200, a PLC housing can be obtained. In certain exemplary embodiments, the PLC housing can comprise a top portion and a bottom portion. The top portion of the PLC housing can be adapted to be releasably and/or snapably coupled to the bottom portion of the PLC housing to form the PLC housing. The PLC housing can comprise a plurality of slots and/or mounts, each of which can be adapted to receive one of the plurality of circuit boards. The plurality of slots and/or mounts can be adapted to physically restrain and/or couple the plurality of circuit boards to the PLC housing without electrically or communicatively coupling the circuit boards via a backplane. In certain exemplary embodiments, a system associated with the PLC housing can lack a backplane.

At activity 5300, the plurality of circuit boards can be mounted in the housing via the plurality of slots and/or mounts. The plurality of slots and/or mounts can be adapted to restrain motion of the plurality of circuit boards in at least two mutually perpendicular directions. When coupled, the top portion and/or the bottom portion of the PLC can be adapted to restrain motion of the plurality of circuit board in a third direction, which is mutually perpendicular to each of the at least two mutually perpendicular directions. The plurality of circuit boards can be mounted manually and/or automatically. In certain exemplary embodiments, if the plurality of circuit boards is mounted manually, each board can be inserted into a portion of the PLC housing one at a time and then adjusted in at least one direction to communicatively couple circuit boards comprised by the PLC. In certain exemplary embodiments, if the plurality of circuit boards is mounted automatically, each of the boards comprised by the PLC can be communicatively coupled via surface mount connectors and/or then slid as a coupled assembly into the portion of the PLC housing.

At activity 5400, the plurality of circuit boards can be communicatively coupled, one with another, via one or more surface mount connectors comprised by each of the plurality of circuit boards. The surface mount connectors can communicatively couple the circuit boards without a system bus or a backplane.

At activity 5500, one or more of the plurality of circuit boards can be coupled to external devices via edge connectors, each edge connector releasably attached to a corresponding edge interface of a circuit board of the plurality of circuit boards.

At activity 5600, the PLC can be operated. The PLC can be adapted to receive inputs from a process and/or control outputs provided to the process in hard real-time.

Definitions

When the following terms are used substantively herein, the accompanying definitions apply. These terms and definitions are presented without prejudice, and, consistent with the application, the right to redefine these terms during the prosecution of this application or any application claiming priority hereto is reserved. For the purpose of interpreting a claim of any patent that claims priority hereto, each definition (or redefined term if an original definition was amended during the prosecution of that patent), functions as a clear and unambiguous disavowal of the subject matter outside of that definition.

a—at least one.
activity—an action, act, deed, function, step, and/or process and/or a portion thereof.
adapted to—suitable, fit, and/or capable of performing a specified function.
adjacent—in close proximity to, near, next to, and/or adjoining.
air—the earth's atmospheric gas.
air flow—a current of air.
and/or—either in conjunction with or in alternative to.
apparatus—an appliance or device for a particular purpose.
approximately—about and/or nearly the same as.
associated with—related to.
at least—not less than.
backplane—a communications bus via which individual components, such as slide-in circuit boards, are electrically and/or communicatively coupled.
between—in a separating interval and/or intermediate to.
circuit board—a substantially electrically non-conductive substrate sheet of material on and/or through which an arrangement of electronic components are electrically and/or communicatively coupled; e.g., a printed wiring board and/or a printed circuit board.
circuit board mount—an apparatus and/or system adapted to attach a substantially planar circuit board to a housing and/or to physically restrain motion of the circuit board from motion in at least two substantially perpendicular directions.
can—is capable of, in at least some embodiments.
channel—a defined passage, conduit, and/or groove for conveying one or more fluids; and/or a frequency, wavelength, and/or code value and/or range associated with the transmission of one or more communication signals.
circuit—an electrically conductive pathway and/or a communications connection established across two or more switching devices comprised by a network and between corresponding end systems connected to, but not comprised by the network.
communicatively couple—to link in a manner that facilitates communications.
component—a constituent element and/or part.
comprised by—included by.
comprise—to include but not be limited to.
conduct—to convey heat from a first object to a second object via substantially direct contact between the first object and the second object.
configured to—suitable, fit, and/or capable of performing a specified function.
connect—to physically and/or logically link.
connector—a device and/or system adapted to physically or logically join, link, couple, and/or fasten two or more entities.
convective—characterized by a circulation of currents from one region to another in a fluid.
cooling—reducing a temperature of a substance.
corresponding—related, associated, accompanying, similar in purpose and/or position, conforming in every respect, and/or equivalent and/or agreeing in amount, quantity, magnitude, quality, and/or degree.
couplable—capable of being joined, connected, and/or linked together.
couple—to join, link, and/or connect.
define—to establish the meaning, relationship, outline, form, and/or structure of; and/or to precisely and/or distinctly describe and/or specify.
degrees Celsius—a unit of temperature. The Celsius temperature scale defines the freezing point of water is 0 degrees, and the boiling point is 100 degrees at standard atmospheric pressure.
determine—to obtain, calculate, decide, deduce, establish, and/or ascertain.
device—a machine, manufacture, and/or collection thereof.
direct current (DC)—a non-alternating electric current.
dissipate—to cause to lose irreversibly. For example, transferring energy to a surrounding environment dissipates that energy.
each—every one of a group considered individually.
electrically couple—to link in a manner that facilitates a flow of electrons.
energy—usable power.
expansion Input/Output module—an enclosure adapted to house one or more Input/Output circuit boards of a programmable logic controller and adapted to communicatively connect to the programmable logic controller.
flexure—bending deformation.
for—with a purpose of.
from—used to indicate a source.
further—in addition.
generate—to create, produce, render, give rise to, and/or bring into existence.
greater—larger and/or more than.
group—a plurality of determined units.
hard real-time—relating to computer systems that provide an absolute deterministic response to an event. Such a response is not based on average event time. Instead, in such computer systems, the deadlines are fixed and the system must guarantee a response within a fixed and well-defined time. Systems operating in hard real-time typically interact at a low level with physical hardware via embedded systems, and can suffer a critical failure if time constraints are violated. A classic example of a hard real-time computing system is the anti-lock brakes on a car. The hard real-time constraint, or deadline, in this system is the time in which the brakes must be released to prevent the wheel from locking. Another example is a car engine control system, in which a delayed control signal might cause engine failure or damage. Other examples of hard real-time embedded systems include medical systems such as heart pacemakers and industrial process controllers.

have—to be identified by.

heat—energy associated with the motion of atoms and/or molecules and capable of being transmitted through solid and/or fluid media by conduction, through fluid media by convection, and/or through a fluid and/or empty space by radiation.

height—a measurement of the extent of something along a dimension.

housing—something that covers, encloses, protects, holds, and/or supports, such as a frame, box, and/or chassis.

identical—substantially similar.

length—a longest dimension of something and/or the measurement of the extent of something along its greatest dimension.

input—a signal, data, and/or information provided to a processor, device, and/or system.

jack—a device and/or system adapted to electrically couple a component to a source of electrical energy.

less than—having a measurably smaller magnitude and/or degree as compared to something else.

mating—one of a matched pair.

may—is allowed and/or permitted to, in at least some embodiments.

memory—a device capable of storing analog or digital information, for example, a non-volatile memory, volatile memory, Random Access Memory, RAM, Read Only Memory, ROM, flash memory, magnetic media, a hard disk, a floppy disk, a magnetic tape, an optical media, an optical disk, a compact disk, a CD, a digital versatile disk, a DVD, and/or a raid array, etc. The memory can be coupled to a processor and/or can store instructions adapted to be executed by processor according to an embodiment disclosed herein.

memory module—a programmable logic controller component that comprises a memory that is substantially non-destructively removable by user and is adapted to store, transport, and transfer data and/or instructions from one PLC to another.

method—a process, procedure, and/or collection of related activities for accomplishing something.

more—in greater quantity.

mount—(n) that upon which a thing is attached. (v) to couple, fix, and/or attach on and/or to something.

none—not a single one.

not—a negation of something.

obtain—to receive, get, take possession of, procure, acquire, calculate, determine, and/or compute.

one—a single unit.

one other—a single thing that is distinct from a referenced element.

opening—an aperture.

output—(n) something produced and/or generated; data produced by an information device executing machine-readable instructions; and/or the energy, power, work, signal, and/or information produced by a system. (v) to provide, produce, manufacture, and/or generate.

outside—the space beyond a boundary and/or limit.

parallel—of, relating to, or designating lines, curves, planes, and/or or surfaces everywhere equidistant and/or an arrangement of components in an electrical circuit that splits an electrical current into two or more paths.

physically—in a tangible, real, and/or actual manner.

planar—shaped as a substantially flat two-dimensional surface.

plane—a surface containing all the straight lines that connect any two points on it.

plug connection—a system adapted to communicatively and/or electrically couple two devices, the system comprising a prong and a corresponding mating socket.

plurality—the state of being plural and/or more than one.

portion—a part, component, section, percentage, ratio, and/or quantity that is less than a larger whole. Can be visually, physically, and/or virtually distinguishable and/or non-distinguishable.

position—(n) a place and/or location, often relative to a reference point. (v) to place and/or locate.

power supply—one or more electrically coupled components configured to provide electrical energy to a device or system.

produce—to generate via a physical effort.

predetermined—established in advance.

predict—prognosticate regarding a future event.

processor—a hardware, firmware, and/or software machine and/or virtual machine comprising a set of machine-readable instructions adaptable to perform a specific task. A processor can utilize mechanical, pneumatic, hydraulic, electrical, magnetic, optical, informational, chemical, and/or biological principles, mechanisms, signals, and/or inputs to perform the task(s). In certain embodiments, a processor can act upon information by manipulating, analyzing, modifying, and/or converting it, transmitting the information for use by an executable procedure and/or an information device, and/or routing the information to an output device. A processor can function as a central processing unit, local controller, remote controller, parallel controller, and/or distributed controller, etc. Unless stated otherwise, the processor can be a general-purpose device, such as a microcontroller and/or a microprocessor, such the Pentium IV series of microprocessor manufactured by the Intel Corporation of Santa Clara, Calif. In certain embodiments, the processor can be dedicated purpose device, such as an Application Specific Integrated Circuit (ASIC) or a Field Programmable Gate Array (FPGA) that has been designed to implement in its hardware and/or firmware at least a part of an embodiment disclosed herein. A processor can reside on and use the capabilities of a controller.

provide—to furnish, supply, give, convey, send, and/or make available.

programmable logic controller—PLC—a solid-state, microprocessor-based, hard real-time computing system that is used, via a network, to automatically monitor the status of field-connected sensor inputs, and/or automatically control communicatively-coupled devices of a controlled industrial system (e.g., actuators, solenoids, relays, switches, motor starters, speed drives (e.g., variable frequency drives, silicon-controlled rectifiers, etc.), pilot lights, ignitors, tape drives, speakers, printers, monitors, displays, etc.) according to a user-created set of values and/or user-created logic and/or instructions stored in memory. The sensor inputs reflect measurements and/or status information related to the controlled industrial system. A PLC provides any of: automated input/output control; switching; counting; arithmetic operations; complex data manipulation; logic; timing; sequencing; communication; data file manipulation; report generation; control; relay control; motion control; process control; distributed control; and/or monitoring of processes, manufacturing equipment, and/or other automation of the controlled industrial system. Because of its precise and hard real-time timing and sequencing capabilities, a PLC is programmed using ladder logic or some form of structured programming language specified in IEC 61131-3, namely, FBD (Function Block Diagram), LD (Ladder Diagram), ST (Structured Text, Pascal type language), IL (Instruction List) and/or SFC (Sequential Function Chart). Because of its precise and real-time timing and sequencing capabilities, a PLC can replace up to thousands of relays and cam timers. PLC hardware often has good redundancy and fail-over capabilities. A PLC can use a Human-Machine Interface (HMI) for interacting with users for configuration, alarm reporting, and/or control.

rate—to estimate a performance capability.

receive—to gather, take, acquire, obtain, accept, get, and/or have bestowed upon.

regarding—pertaining to.

relative—considered with reference to and/or in comparison to something else.

restrain—to limit and/or restrict.

said—when used in a system or device claim, an article indicating a subsequent claim term that has been previously introduced.

selected—a chosen item.

slot—a narrow opening and/or aperture.

soft real-time—relating to computer systems that take a best efforts approach and minimize latency from event to response as much as possible while keeping throughput up with external events overall. Such systems will not suffer a critical failure if time constraints are violated. For example, live audio-video systems are usually soft real-time; violation of time constraints can result in degraded quality, but the system can continue to operate. Another example is a network server, which is a system for which fast response is desired but for which there is no deadline. If the network server is highly loaded, its response time may slow with no failure in service. This is contrasted with the anti-lock braking system where a slow down in response would likely cause system failure, possibly even catastrophic failure.

substantially—to a considerable, large, and/or great, but not necessarily whole and/or entire, extent and/or degree.

surface—the outer boundary of an object or a material layer constituting or resembling such a boundary.

surface mount connector—a device and/or system that is mounted directly to a substantially planar surface of a circuit board and is adapted to electrically and/or communicatively couple the circuit board to another circuit board, such as via a prong and socket arrangement and/or a blade and biased groove arrangement, etc.

system—a collection of mechanisms, devices, data, and/or instructions, the collection designed to perform one or more specific functions.

temperature—measure of the average kinetic energy of the molecules in a sample of matter, expressed in terms of units or degrees designated on a standard scale.

terminal block—a device and/or system adapted to secure an uninsulated end of an electrical wire and communicatively couple the wire to a circuit board and/or bus.

transfer—(n) a transmission from one device, place, and/or state to another. (v) to convey from one device, place, and/or state to another.

utilize—to use and/or put into service.

via—by way of and/or utilizing.

when—at a time.

wherein—in regard to which; and; and/or in addition to.

width—a measurement of the extent of something along a dimension.

Note

Still other substantially and specifically practical and useful embodiments will become readily apparent to those skilled in this art from reading the above-recited and/or herein-included detailed description and/or drawings of certain exemplary embodiments. It should be understood that numerous variations, modifications, and additional embodiments are possible, and accordingly, all such variations, modifications, and embodiments are to be regarded as being within the scope of this application.

Thus, regardless of the content of any portion (e.g., title, field, background, summary, abstract, drawing figure, etc.) of this application, unless clearly specified to the contrary, such as via an explicit definition, assertion, or argument, with respect to any claim, whether of this application and/or any claim of any application claiming priority hereto, and whether originally presented or otherwise:

there is no requirement for the inclusion of any particular described or illustrated characteristic, function, activity, or element, any particular sequence of activities, or any particular interrelationship of elements;

any elements can be integrated, segregated, and/or duplicated;

any activity can be repeated, performed by multiple entities, and/or performed in multiple jurisdictions; and any activity or element can be specifically excluded, the sequence of activities can vary, and/or the interrelationship of elements can vary.

Moreover, when any number or range is described herein, unless clearly stated otherwise, that number or range is approximate. When any range is described herein, unless clearly stated otherwise, that range includes all values therein and all subranges therein. For example, if a range of 1 to 10 is described, that range includes all values therebetween, such as for example, 1.1, 2.5, 3.335, 5, 6.179, 8.9999, etc., and includes all subranges therebetween, such as for example, 1 to 3.65, 2.8 to 8.14, 1.93 to 9, etc.

Any information in any material (e.g., a U.S. patent, U.S. patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

Accordingly, every portion (e.g., title, field, background, summary, abstract, drawing figure, etc.) of this application, other than the claims themselves, is to be regarded as illustrative in nature, and not as restrictive.

What is claimed is:

1. A programmable logic controller (PLC) system comprising:

a PLC housing comprising a plurality of circuit board mounts, each of said plurality of circuit board mounts configured to physically position a first circuit board of a plurality of circuit boards, none of said plurality of circuit board mounts configured to electrically or communicatively couple said first circuit board to any other system component, said PLC housing not comprising a backplane, said PLC housing not coupled to a backplane; and said first circuit board selected from a group comprising a power supply circuit board, a processor circuit board, and an Input/Output circuit board, said first circuit board one of said plurality of circuit boards, said first circuit board substantially planar and defining a first plane, said first circuit board comprising a surface mount connector, said surface mount connector configured to communicatively couple said first circuit board to a second circuit board of said plurality of circuit boards that comprises a corresponding mating connector, when coupled, said corresponding mating connector of said second circuit board and said surface mount connector of said first circuit board configured to define a first substantially convective heat transfer channel between said second circuit board and said first circuit board, said first channel configured to dissipate heat generated by components of said second circuit board and said first circuit board.

2. The system of claim 1, wherein, when coupled, said surface mount connector of said first circuit board and said corresponding mating connector of said second circuit board are configured to restrain flexure of said second circuit board relative to said first circuit board such that, for any flexure of said first circuit board, at least a portion of said second plane defined by said second circuit board will be substantially parallel to at least a portion of said first plane defined by said first circuit board.

3. The system of claim 1, wherein said first circuit board is said Input/Output circuit board.

4. The system of claim 1, wherein said first circuit board is said power supply circuit board.

5. The system of claim 1, wherein said first circuit board is said processor circuit board.

6. The system of claim 1, further comprising:
an expansion Input/Output module configured to be connected via a plug connection to said PLC system, said PLC system comprising a plug component portion communicatively couplable to a corresponding plug component portion of said expansion Input/Output module.

7. The system of claim 1, further comprising:
an expansion Input/Output module configured to be connected via a plug connection to said PLC housing, said PLC housing comprising a plug component portion communicatively couplable to a corresponding plug component portion of said expansion Input/Output module, wherein said expansion Input/Output module is configured to mount a plurality of expansion Input/Output circuit boards that are substantially identical to at least one circuit board of said plurality of circuit boards.

8. The system of claim 1, wherein, said PLC housing is configured to mount said plurality of circuit boards.

9. The system of claim 1, wherein said plurality of circuit boards comprises said processor circuit board and said Input/Output circuit board.

10. The system of claim 1, wherein, said PLC housing is configured to mount said plurality of circuit boards such that said first plane and each plane defined by each of said plurality of circuit boards are substantially parallel.

11. The system of claim 1, wherein, when mounted in said PLC housing, each of said plurality of circuit boards are configured to conductively transfer heat to said PLC housing.

12. The system of claim 1, wherein, said PLC housing configured to substantially surround each of said plurality of circuit boards.

13. The system of claim 1, wherein said second circuit board is said processor circuit board.

14. The system of claim 1, wherein said second circuit board is said Input/Output circuit board.

15. The system of claim 1, wherein said plurality of circuit boards comprises a plurality of substantially identical Input/Output circuit boards.

16. The system of claim 1, wherein said PLC housing defines an opening configured to receive a direct current (DC) jack, said DC jack electrically couplable to said power supply circuit board.

17. The system of claim 1, wherein said PLC housing defines an opening configured to receive a direct current (AC) jack, said AC jack electrically couplable to said power supply circuit board.

18. The system of claim 1, wherein said PLC housing defines an opening configured to receive a terminal block, said terminal block configured to be communicatively coupled to said Input/Output circuit board of said plurality of circuit boards.

19. The system of claim 1, wherein said PLC housing comprises a plurality of slots, each of said plurality of slots configured to receive one of said plurality of circuit boards.

20. The system of claim 1, wherein said PLC housing defines an opening configured to receive a memory module.

21. A programmable logic controller (PLC) comprising:
a first circuit board selected from a group comprising a power supply circuit board, a processor circuit board, and an Input/Output circuit board, said first circuit board one of a plurality of circuit boards, said first circuit board substantially planar and defining a first plane, said first circuit board comprising a surface mount connector, said surface mount connector configured to communicatively couple said first circuit board to a second circuit board of said plurality of circuit boards that comprises a corresponding mating connector, when coupled, said corresponding mating connector of said second circuit board and said surface mount connector of said first circuit board configured to define a first substantially convective heat transfer channel between said second circuit board and said first circuit board, said first substantially convective heat transfer channel configured to dissipate heat generated by components of said second circuit board and said first circuit board, when coupled, said corresponding mating connector of said second circuit board and said surface mount connector of said first circuit board configured to restrain flexure of said first circuit board relative to said second circuit board such that, for any flexure of said second circuit board, at least a portion of said first plane defined by said first circuit board will be substantially parallel to at least a portion of a second plane defined by said second circuit board.

* * * * *